United States Patent
Jung et al.

(10) Patent No.: US 11,740,499 B2
(45) Date of Patent: Aug. 29, 2023

(54) DISPLAY DEVICE INCLUDING A SURFACE-MODIFIED ADHESIVE AREA AND A METHOD OF MANUFACTURING THE SAME

(71) Applicant: Samsung Display Co., Ltd., Yongin-Si (KR)

(72) Inventors: Jiwon Jung, Seoul (KR); Youngji Kim, Hwaseong-si (KR); Yiseul Um, Chungcheongnam-do (KR); Younghoon Lee, Gwangmyeong-si (KR); Wonje Jo, Ansan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/518,763

(22) Filed: Nov. 4, 2021

(65) Prior Publication Data
US 2022/0057665 A1 Feb. 24, 2022

Related U.S. Application Data

(62) Division of application No. 16/789,663, filed on Feb. 13, 2020, now Pat. No. 11,199,737.

(30) Foreign Application Priority Data

Feb. 18, 2019 (KR) ........................ 10-2019-0018471

(51) Int. Cl.
G02B 1/14 (2015.01)
G02F 1/1333 (2006.01)
(Continued)

(52) U.S. Cl.
CPC .... *G02F 1/13338* (2013.01); *G02F 1/133528* (2013.01); *C09J 2203/318* (2013.01); *C09K 2323/00* (2020.08); *C09K 2323/05* (2020.08); *G02F 1/1316* (2021.01); *G02F 2201/50* (2013.01); *G02F 2202/16* (2013.01); *G02F 2202/28* (2013.01)

(58) Field of Classification Search
CPC ............ G02F 1/1338; G02F 1/133528; G02F 1/1316; G02F 1/133308; G02F 1/133354; G02F 2201/50; G02F 2202/28; C09K 2323/00; C09K 2323/05; C09K 2323/053
USPC ........................................ 428/1.1, 1.5, 1.52
See application file for complete search history.

(56) References Cited

U.S. PATENT DOCUMENTS 8,721,389 B2 5/2014 Jung et al.
8,721,392 B2 5/2014 Brown et al.
(Continued)

FOREIGN PATENT DOCUMENTS

| JP | 2013-101783 | 5/2013 |
| KR | 10-1620375 | 5/2016 |
| KR | 10-1854282 | 5/2018 |

*Primary Examiner* — Ruiyun Zhang
(74) *Attorney, Agent, or Firm* — F. Chau & Associates, LLC

(57) ABSTRACT

A display device includes: a display module including a first area and a second area at least partially surrounding the first area in a plan view; an external member disposed on the display module; and an adhesive layer configured to couple the display module to the external member, wherein a coupling strength between the second area and the adhesive layer is greater than a coupling strength between the first area and the adhesive layer.

10 Claims, 15 Drawing Sheets

(51) Int. Cl.
*G02F 1/1335* (2006.01)
*G02F 1/13* (2006.01)

(56) References Cited

U.S. PATENT DOCUMENTS

| | | |
|---|---|---|
| 8,854,591 B2 | 10/2014 | Liu et al. |
| 9,474,125 B2 | 10/2016 | Kim et al. |
| 9,720,268 B2 | 8/2017 | Liu et al. |
| 2016/0009956 A1 | 1/2016 | Hwang |
| 2016/0062516 A1 | 3/2016 | Jeong et al. |
| 2016/0172346 A1* | 6/2016 | Koresawa ............ H01L 23/293 |
| | | 257/99 |
| 2020/0264465 A1 | 8/2020 | Jung et al. |

* cited by examiner

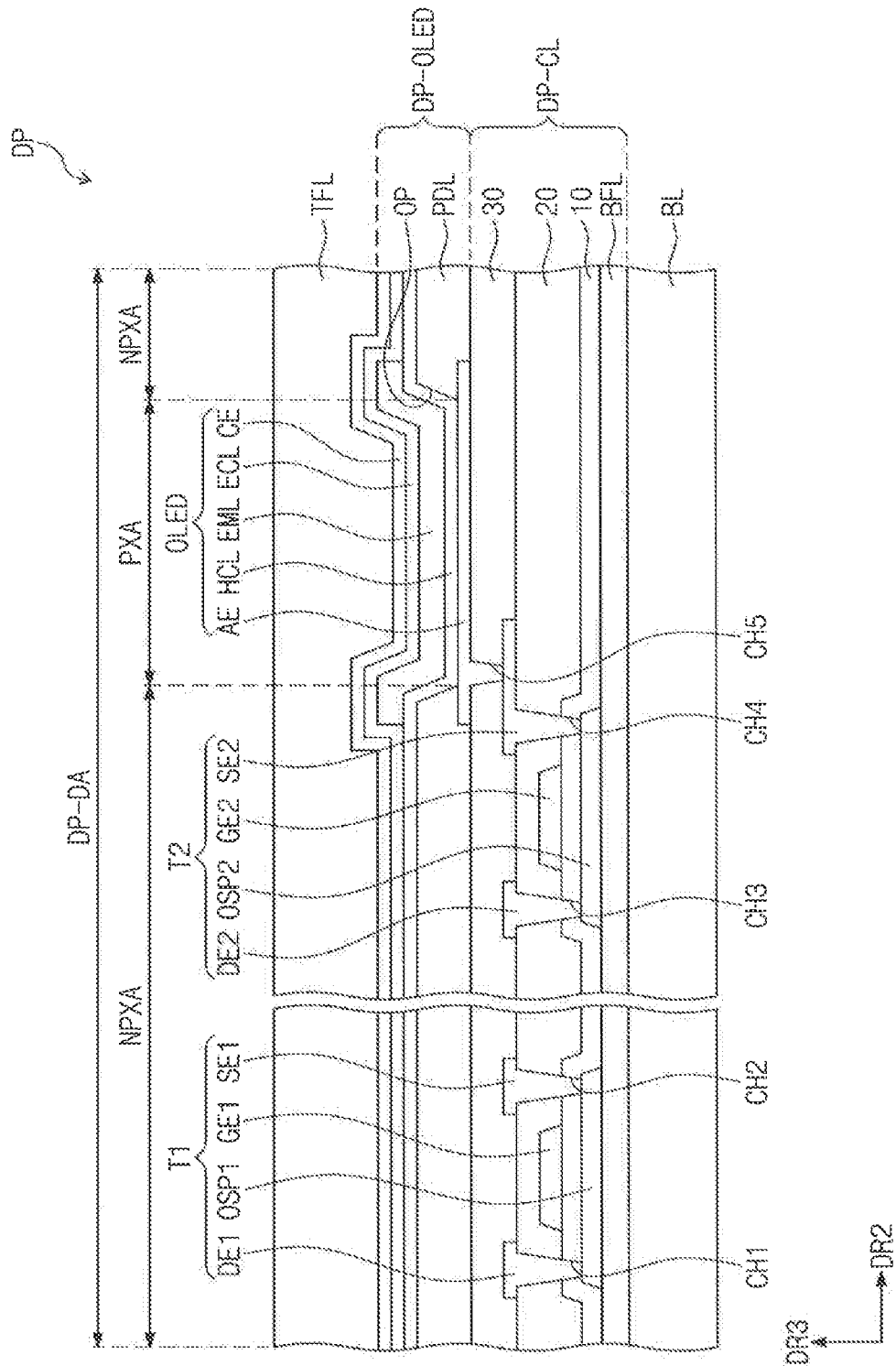

DISPLAY DEVICE INCLUDING A SURFACE-MODIFIED ADHESIVE AREA AND A METHOD OF MANUFACTURING THE SAME

CROSS-REFERENCE TO RELATED APPLICATIONS

This U.S. non-provisional patent application is a divisional of U.S. patent application Ser. No. 16/789,663 filed on Feb. 13, 2020, which claims priority under 35 U.S.C. § 119 to Korean Patent Application No. 10-2019-0018471, filed on Feb. 18, 2019, the disclosures of which are incorporated by reference herein in their entireties.

TECHNICAL FIELD

Exemplary embodiments of the present invention relate to a display device and a method of manufacturing the same, and more particularly, to a display device including a surface-modified adhesive area and a method of manufacturing the display device, which includes a surface-modification process.

DISCUSSION OF THE RELATED ART

Various display devices included in multimedia devices, such as televisions, mobile phones, tablet computers, navigation devices, and game devices, have been developed. The display devices include various functional components, e.g., a display module, an input sensor, a window, and/or an optical film.

The functional components may be coupled to each other after a manufacturing or fabricating process. For example, a display device having a laminated structure may be manufactured through a plurality of coupling processes.

SUMMARY

According to an exemplary embodiment of the present inventive concept, a display device includes: a display module including a first area and a second area at least partially surrounding the first area in a plan view; an external member disposed on the display module; and an adhesive layer configured to couple the display module to the external member, wherein a coupling strength between the second area and the adhesive layer is greater than a coupling strength between the first area and the adhesive layer.

In an exemplary embodiment of the present inventive concept, an edge of the display module is disposed in the second area.

In an exemplary embodiment of the present inventive concept, the second area leas a width within a range from about 50 micrometers to about 300 micrometers.

In an exemplary embodiment of the present inventive concept, the display module includes: a display panel; an input sensor disposed on the display panel and providing a base surface in contact with the adhesive layer; and a residual adhesive material disposed on the base surface.

In an exemplary embodiment of the present inventive concept, a residual amount per unit area of the residual adhesive material with respect to the first area is larger than a residual amount per unit area of the residual adhesive material with respect to the second area.

In an exemplary embodiment of the present inventive concept, the input sensor includes a first conductive pattern; an inorganic layer covering the first conductive pattern; a second conductive pattern disposed on the inorganic layer; and an organic layer covering the second conductive pattern and includes the base surface.

In an exemplary embodiment of the present inventive concept, the display panel includes: a display area overlapping the first area, and including light emitting diodes; and a non-display area disposed adjacent to the display area in a plan view, and overlapping the first area and the second area.

In an exemplary embodiment of the present inventive concept, the adhesive layer and the residual adhesive material each include different adhesive materials from each other.

In an exemplary embodiment of the present inventive concept, the adhesive layer includes an acrylic-based adhesive material, and the residual adhesive material includes a silicon-based adhesive material or a urethane-based adhesive material.

In an exemplary embodiment of the present inventive concept, the external member includes a polarization film or a window.

According to an exemplary embodiment of the present inventive concept, a method of manufacturing a display device includes: providing a working panel attached to a working protective film, the working panel including a plurality of cell areas and a peripheral area adjacent to the cell areas; patterning the working protective film to expose the peripheral area to an outside and to remain cell protective films corresponding to the cell areas; cutting the working panel along the peripheral area to form a plurality of display modules, wherein cell protective films of the working protective film are respectively attached; surface-modifying an outer area of a first display module of the plurality of display modules exposed by a corresponding cell protective film among the cell protective films; grinding an edge of the outer area of the first display module; cleaning the first display module; removing the corresponding cell protective film from the first display module; and attaching the first display module to an external member.

In an exemplary embodiment of the present inventive concept, the surface-modifying includes plasma-treating the outer area of the first display module.

In an exemplary embodiment of the present inventive concept, a hydrophilic property of the outer area of the first display module increases after the plasma-treating.

In an exemplary embodiment of the present inventive concept, the surface-modifying includes providing a surfactant to the outer area of the first display module.

In an exemplary embodiment of the present inventive concept, the cleaning of the first display module includes providing a cleaning liquid to the outer area of the first display module.

In an exemplary embodiment of the present inventive concept, the cleaning liquid includes a surface.

In an exemplary embodiment of the present inventive concept, an area overlapping with the corresponding cell protective film of the first display module is as an inner area of the first display module, and the inner area has an area greater than the outer area of the first display module.

In an exemplary embodiment of the present inventive concept, the outer area has a width from about 50 micrometers to about 300 micrometers.

In an exemplary embodiment of the present inventive concept, in the removing of the corresponding cell protective film, the inner area of the first display module has a residual amount per unit area of a residual adhesive material, wherein the residual amount per unit area of the residual adhesive material of the inner area is greater than that of the outer area of the first display module.

In an exemplary embodiment of the present inventive concept, a coupling strength between the first display module and the external member in the outer area is greater than a coupling strength between the first display module and the external member in the inner area.

BRIEF DESCRIPTION OF THE DRAWINGS

The above and other features of the present inventive concept will become apparent by describing in detail exemplary embodiments thereof, with reference to the accompanying drawings, in which:

FIG. 4B is an enlarged cross-sectional view illustrating a display panel according to an exemplary embodiment of the present inventive concept;

DETAILED DESCRIPTION OF THE EMBODIMENTS

Figure 1:
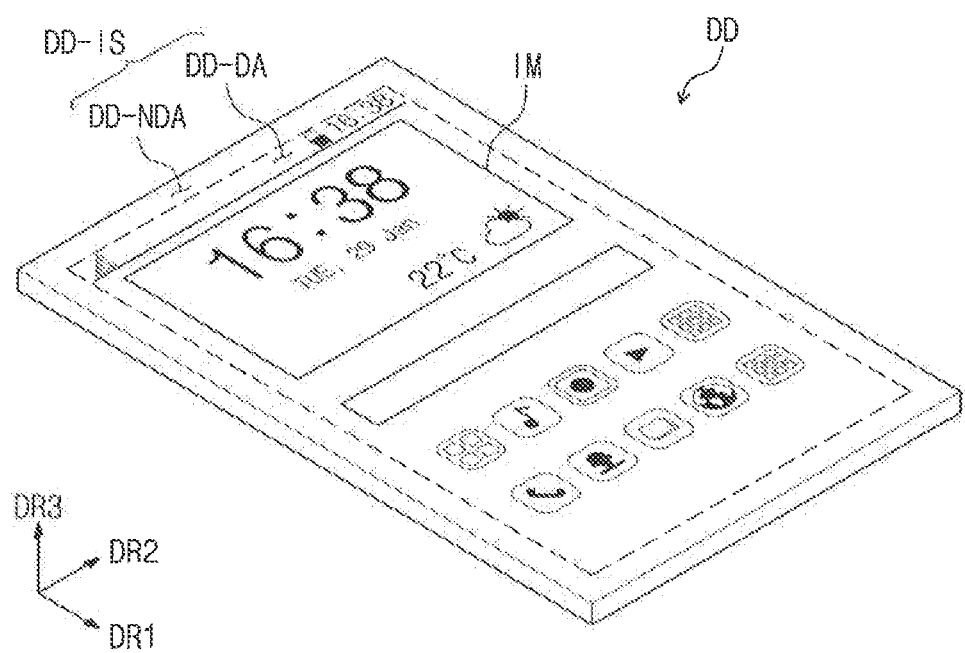
FIG. 1 is a perspective view illustrating a display device according to an exemplary embodiment of the present inventive concept.

It will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification and drawings, and thus repetitive descriptions may be omitted. In the drawings, the thickness, any ratios, and any dimensions of components may be exaggerated for clarity. As used herein, the term "and/or" includes at least any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of exemplary embodiments of the present inventive concept. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

FIG. 1 is a perspective view illustrating a display device DD according to an exemplary embodiment of the present inventive concept. As illustrated in FIG. 1, the display device DD displays an image IM through a display surface DD-IS. The display surface DD-IS is substantially parallel to a surface defined by a first directional axis DR1 and a second directional axis DR2. A third directional axis DR3 indicates a normal line direction of the display surface DD-IS, a thickness direction of the display device DD.

Front (or, e.g., upper) and rear (or, e.g., lower) surfaces of each member or each unit described below are distinguished from each other by the third directional axis DR3. However, directions indicated by the first, second, and third directional axes DR1, DR2, and DR3 are merely exemplary. Hereinafter, first, second, and third directions respectively correspond to directions indicated by the first, second, and third directional axes DR1, DR2, and DR3 and are assigned with the same reference numerals as the first, second, and third directional axes DR1, DR2, and DR3.

In the exemplary embodiment of the present inventive concept, the display device DD includes a flat display surface; however, the present inventive concept should not be limited thereto or thereby. For example, the display device DD may include a curved display surface or a three-dimensional display surface. For example, the three-dimensional display surface may include a plurality of display areas extending in different directions from each other, for example, a polygonal column shaped display surface.

The display device DD according to the present exemplary embodiment may be a flexible display device; however, the present inventive concept is not limited thereto. For example, the display device DD according to the present exemplary embodiment may be a rigid display device DD. In the present exemplary embodiment, the display device DD may be applied to a mobile phone terminal, which is illustrated as a representative example. Although not illustrated in figures, electronic modules, a camera module, and a power module, which ma be mounted on a circuit board, may be placed on a bracket and/or a case with the display device DD to form the mobile phone terminal. The display device DD according to the present inventive concept may be applied to a relatively large-sized electronic item, such as a television set and a monitor, and to relatively small and medium-sized electronic items, such as a tablet computer, a car navigation device, a game device, and a smart watch.

As illustrated in FIG. 1, the display surface DD-IS includes an image area DD-DA through which the image IM is displayed, and a bezel area DD-NDA adjacent to the image area DD-DA. For example, the bezel area DD-NDA may at least partially surround the image area DD-DA. The image IM is not displayed through the bezel area DD-NDA. FIG. 1 shows icon images as a representative example of the image IM.

As illustrated in FIG. 1, the image area DD-DA may have a quadrangular shape. The bezel area DD-NDA may surround the image area DD-DA. However, they should not be limited thereto or thereby. The shape of the image area DD-DA and the shape of the bezel area DD-NDA may be relatively designed with respect to each other. For example, the shape of the image area DD-DA and the shape of the bezel area DD-NDA may be a polygonal shape. For example, an edge of the image area DD-DA may include a straight line area and a curved line area.

Figure 2A:
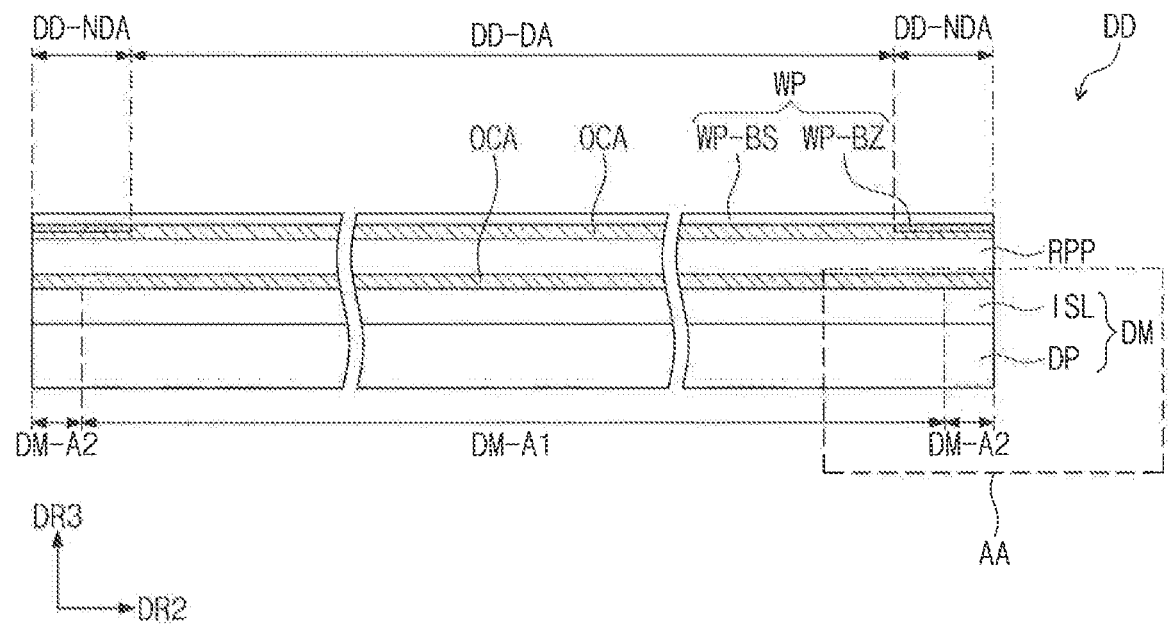
FIGS. 2A, 2B and 2C are cross-sectional views illustrating display devices according to an exemplary embodiment of the present inventive concept.
Figure 2B:
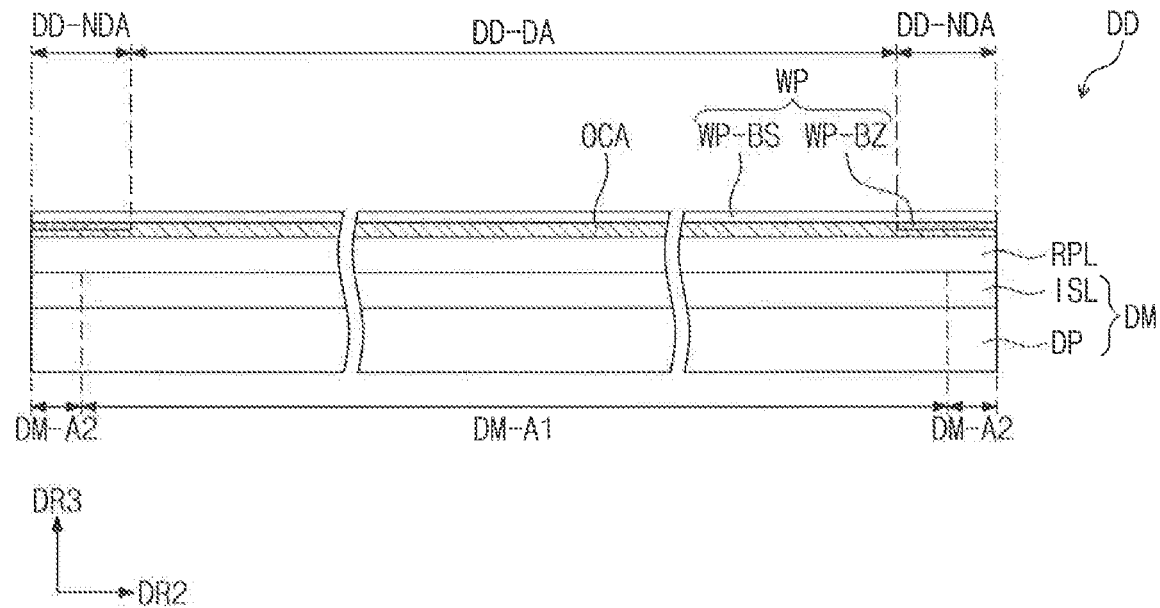
Figure 2C:
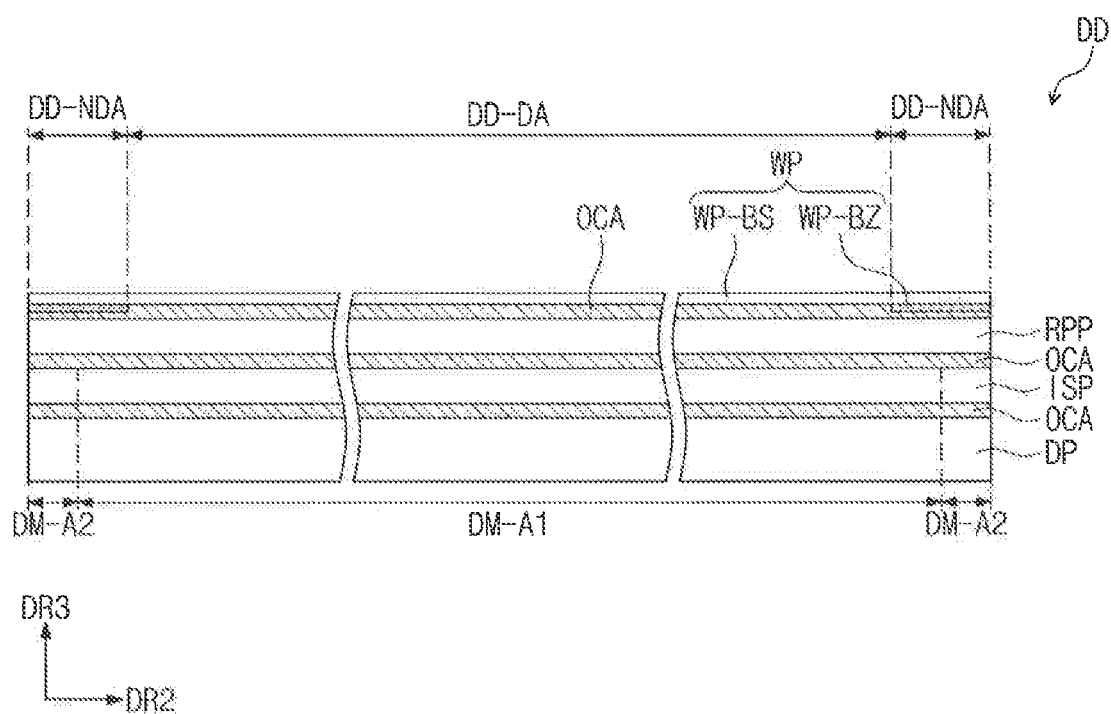

FIGS. 2A to 2C are cross-sectional views illustrating display devices DD according to an exemplary embodiment of the present inventive concept. FIGS. 2A to 2C illustrate cross-sections defined by the second directional axis DR2 and the third directional axis DR3.

The display device DD according to the exemplary embodiment of the present inventive concept may include a display panel, an input sensor, an anti-reflector, and a window. At least some components of the display panel, the input sensor, the anti-reflector, and the window may be formed through successive processes or may be attached to each other by an adhesive layer (or adhesive member). FIGS. 2A to 2C illustrate an optically clear adhesive layer as a representative example of the adhesive layer. For example, the adhesive layer described hereinafter may include a conventional adhesive or pressure sensitive adhesive.

In FIGS. 2A to 2C, among the input sensor, the anti-reflector, and the window, a component formed through the successive processes with another component are referred to as a "layer". Among the input sensor, the anti-reflector, and the window, a component coupled to another component by the adhesive layer are referred to as a "panel". The panel includes a base layer providing a base surface, e.g., a synthetic resin film, a composite film, or a glass substrate; however, the base layer may be omitted from the component referred to as the "layer". In other words, the component referred to as the "layer" is disposed on the base surface provided by another component. For example, the base surface may be a surface of the component.

Hereinafter, the input senor, the anti-reflector, and the window may be respectively referred to as an "input sensing panel ISP", an "anti-reflective panel RP", and a "window panel WP" or respectively referred to as an "input sensing layer ISL", an "anti-reflective layer RPL", and a "window layer" depending on the presence or absence of the base layer. However, the display device including the window layer is not illustrated in FIGS. 2A to 2C.

As illustrated in FIG. 2A, the display device DD may include the display panel DP, the input sensing layer ISL, the anti-reflective panel RPP, and the window panel WP. The input sensing layer ISL is disposed on the display panel DP. For example, the input sensing layer ISL may be directly disposed on the display panel DP. In the present disclosure, the expression "component "B" is directly disposed on component "A"" means that no intervening elements, such as an adhesive layer, are present between the component "B" and the component "A". The component "B" is formed on a base surface provided by the component "A" through successive processes after the component "A" is formed.

The display panel DP and the input sensing layer ISL may form a display module DM. The optically clear adhesive layer OCA is disposed between the display module DM and the anti-reflective panel RPP and between the anti-reflective panel RPP and the window panel WP.

The display panel DP generates the image, and the input sensing layer ISL obtains coordinate information of the external input (e.g., touch event). Although not illustrated separately, the display module DM according to an exemplary embodiment of the present inventive concept may further include a protective member disposed on a lower surface of the display panel DP. The protective member and the display panel DP are coupled to each other by the adhesive layer.

The display panel DP according to an exemplary embodiment of the present inventive concept may be a light emitting type display panel; however, the present inventive concept should not be particularly limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP.

The anti-reflective panel RPP reduces a reflectance of an external light incident thereto from above the window panel WP. The anti-reflective panel RPP according to an exemplary embodiment of the present inventive concept may include a polarizer. The anti-reflective panel RPP may further include a retarder. The polarizer may be a film type or a liquid crystal coating type. For example, the film type polarizer may include a stretching type synthetic resin film, and the liquid crystal coating type polarizer may include liquid crystals arranged in a predetermined arrangement. The retarder may be a film type or a liquid crystal coating type and may include a $\lambda/2$ retarder and a $\lambda/4$ retarder. The polarizer and the retarder may further include a protective film. The retarder and the polarizer or the protective film may be a base layer of the anti-reflective panel RPP.

The anti-reflective panel RPP according to the present exemplary embodiment of the present inventive concept may include color filters. The color filters may have a predetermined arrangement. The arrangement of the color filters may be determined by taking into account emission colors of pixels included in the display panel DP. The anti-reflective panel RPP may further include a black matrix disposed adjacent to the color filters. For example, the color filters and the black matrix may have an alternating arrangement.

The anti-reflective panel RPP according to the present exemplary embodiment of the present inventive concept may include a destructive interference structure. For instance, the destructive interference structure may include a first reflection layer and a second reflection layer, which are disposed on different layers from each other. A first reflection light and a second reflection light, which are reflected by the first reflection layer and the second reflection layer, respectively, may be destructively interfered, and thus the reflectance of the external light may be reduced.

The window panel WP according to the present exemplary embodiment of the present inventive concept includes a base layer WP-BS and a light shielding pattern WP-BZ. The base layer WP-BS may include a glass substrate and/or a synthetic resin film. The base layer WP-BS should not be limited to a single-layer structure. The base layer WP-BS may include two or more films coupled to each other by an adhesive member.

The light shielding pattern WP-BZ partially overlaps with the base layer WP-BS. The light shielding pattern WP-BZ is disposed on a rear surface of the base layer WP-BS. An area in which the light shielding pattern WP-BZ is disposed may correspond to the bezel area DD-NDA of the display device DD. For example, the light shielding pattern WP-BZ overlaps the bezel area DD-NDA.

The light shielding pattern WP-BZ may be a colored organic layer and may be formed through a coating process. Although not illustrated in figures, the window panel WP may further include a functional coating layer disposed on a surface of the base layer WP-BS. The functional coating layer may include, for example, an anti-fingerprint layer, an anti-reflective layer, or a hard coating layer.

As illustrated in FIG. 2B, the display device DD may include a display panel DP, an input sensing layer an anti-reflective layer RPL, and a window panel WP. The anti-reflective layer RPL may include color filters and a blank matrix, which are disposed on a base surface provided by the input sensing layer ISL (e.g., a first surface of the input sensing layer ISL). The anti-reflective layer RPL may further include an organic layer and an inorganic layer. A stacking order of the input sensing layer ISL and the anti-reflective layer RPL may be changed.

As illustrated in FIG. 2C, the display device DD may include a display panel DP, an input sensing panel ISP, an anti-reflective panel RPP, and a window panel WP. A stacking order of the input sensing panel ISP and the anti-reflective panel RPP may be changed.

Figure 3A:
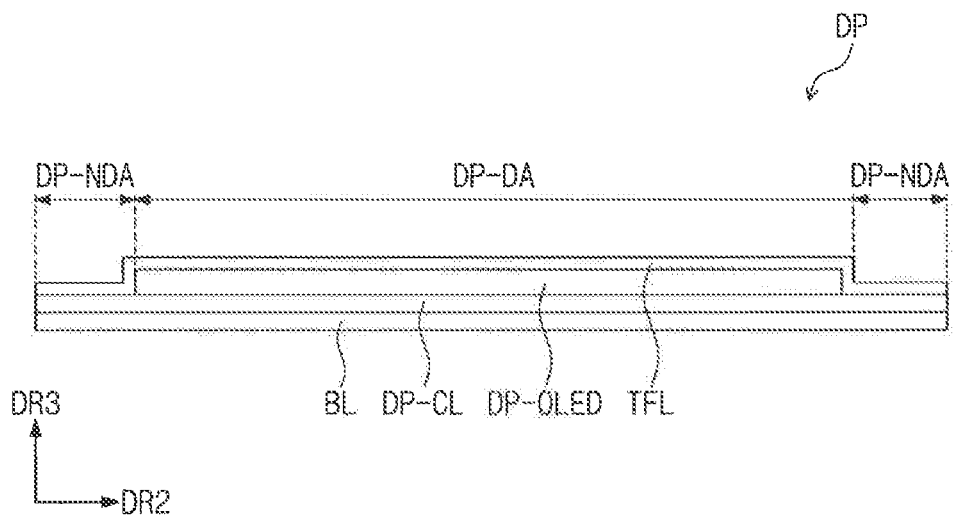
FIGS. 3A and 3B are cross-sectional views illustrating a display panel according to an exemplary embodiment of the present inventive concept.
Figure 3B:
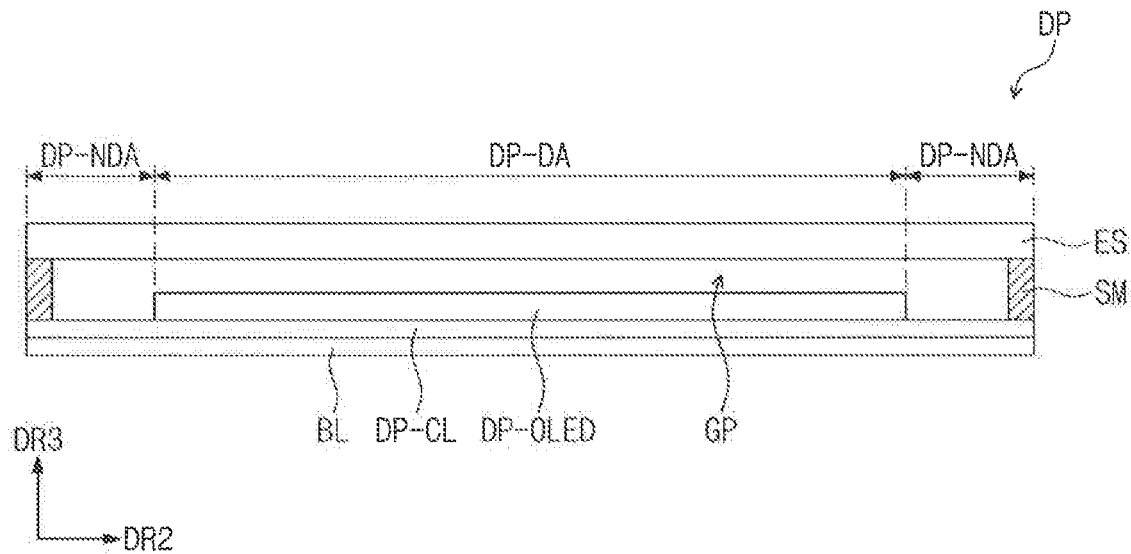

FIGS. 3A and 3B are cross-sectional views illustrating a display panel DP according to an exemplary embodiment of the present inventive concept.

Referring to FIG. 3A, the display panel DP includes a base layer BL, a circuit element layer DP-CL disposed on the base layer BL, a display element layer DP-OLED, and an upper insulating layer TFL. A display area DP-DA and a non-display area DP-NDA, which respectively correspond to the image area DD-DA and the bezel area DD-NDA illustrated in FIG. 1, may be in the display panel DP. The display area DP-DA may be an area in which the pixels are arranged. The non-display area DP-NDA may be an area in which the pixels are not arranged and signal lines (e.g., lines for transmitting driving signals) supporting an operation of the pixels are arranged. In the present disclosure, the expression "an area corresponds to an area" means that "areas overlap with each other", but is not limited to that "areas have the same size".

The base layer BL may include at least one plastic film. The base layer BL may include a plastic substrate, a glass substrate, a metal substrate, or an organic/inorganic composite substrate. In the present exemplary embodiment, the base layer BL may be a thin film glass substrate having a thickness from tens of micrometers to hundreds of micrometers.

The circuit element layer DP-CL includes, for example, at least one insulating layer and a circuit element. For example, the insulating layer includes at least one inorganic layer and at least one organic layer. For example, the circuit element includes signal lines and a driving circuit of the pixels. Detailed descriptions of the circuit element layer DP-CL will be described later.

The display element layer DP-OLED includes at least organic light emitting diodes. The display element layer DP-OLED may further include an organic layer such as a pixel definition layer.

The upper insulating layer TFL includes, for example, a plurality of thin layers. Some layers are disposed to increase optical efficiency, and some layers are disposed to protect the organic light emitting diodes. However, the present inventive concept is not limited thereto. For example, the upper insulating layer TFL may be a single layer for increasing optical efficiency and protecting the organic light emitting diodes.

As illustrated in FIG. 3B, the display panel DP includes a base layer BL, a circuit element layer DP-CL disposed on the base layer BL, a display element layer DP-OLED, an encapsulation substrate ES, and a sealant SM coupling the base layer BL and the encapsulation substrate ES. The encapsulation substrate ES may be spaced apart from the display element layer DP-OLED by a predetermined gap GP. For example, the base layer BL and the encapsulation substrate ES may include a plastic substrate, a glass substrate, a metal substrate, or an organic/inorganic composite substrate. For example, the sealant SM may include an organic adhesive or frit.

Figure 4A:
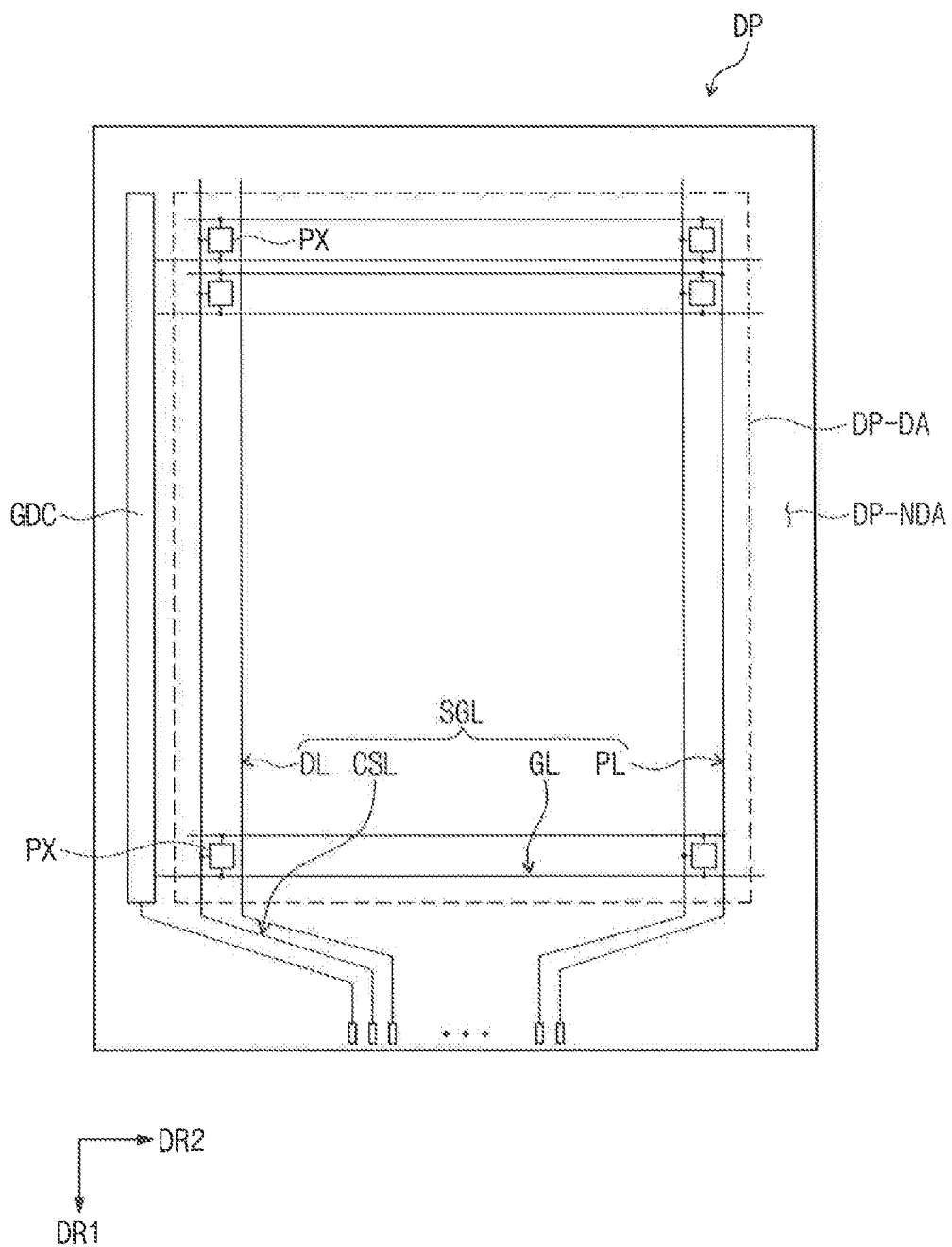
FIG. 4A is a plan view illustrating a display panel according to an exemplary embodiment of the present inventive concept.

FIG. 4A is a plan view illustrating a display panel DP according to an exemplary embodiment of the present inventive concept. FIG. 4B is a cross-sectional view illustrating a display panel DP according to an exemplary embodiment of the present inventive concept. The display panel DP of FIG. 4B is illustrated with reference to the display panel DP of FIG. 3A.

Referring to FIG. 4A, the display panel DP includes a driving circuit GDC, a plurality of signal lines SGL (hereinafter, referred to as "signal lines"), and a plurality of pixels PX (hereinafter, referred to as "pixels").

Each of the pixels PX includes an organic light emitting diode and a pixel driving circuit connected to the organic light emitting diode. The driving circuit GDC, the signal lines SGL, and the pixel driving circuit may be included in the circuit element layer DP-CL illustrated in FIGS. 3A and 3B.

The driving circuit GDC includes a scan driving circuit. The scan driving circuit generates a plurality of scan signals (hereinafter, referred to as "scan signals") and sequentially outputs the scan signals to a plurality of scan lines GL (hereinafter, referred to as "scan lines") described later. The scan driving circuit may further output other control signals to the pixel driving circuit of the pixels PX.

The scan driving circuit may include a plurality of thin film transistors formed through the same processes, e.g., a low temperature polycrystalline silicon (LTPS) process or a low temperature polycrystalline oxide (LTPO) process, as the pixel driving circuit of the pixels PX.

The signal lines SGL include the scan lines GL, data lines DL, a power line PL, and a control signal line CSL. Each of the scan lines GL is connected to a corresponding pixel among the pixels PX, and each of the data lines DL is connected to a corresponding pixel among the pixels PX. The power line PL is connected to the pixels PX. The control signal line CSL provides the scan driving circuit with control signals.

FIG. 4B shows a cross section of the display panel DP including transistors T1 and T2 and a light emitting diode OLED. The circuit element layer DP-CL disposed on the base layer BL includes at least one insulating layer and the circuit element. The circuit element includes the signal lines and the driving circuit of the pixel. The circuit element layer DP-CL may be formed by coating and deposition processes used to form an insulating layer, a semiconductor layer, and a conductive layer. In addition, the circuit element layer DP-CL may be further formed by a photolithography process used to pattern the insulating layer, the semiconductor layer, and the conductive layer.

In the present exemplary embodiment, the circuit element layer DP-CL includes a buffer layer BFL, a first inorganic layer 10, and a second inorganic layer 20, each of which is an inorganic layer. In addition, the circuit element layer DP-CL includes an organic layer 30. The buffer layer BFL includes a plurality of inorganic layers stacked on one another. FIG. 4B shows an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which form a switching transistor T1 and a driving transistor T2, as a representative example. For example, the switching transistor T1 includes the first semiconductor pattern OSP1, the first control electrode GE1, the first input electrode DE1, and the first output electrode SE1, and the driving transistor T2 includes the second semiconductor pattern OSP2, the second control electrode GE2, the second input electrode DE2, and the second output electrode SE2. First to fourth through holes CH1 to CH4 are also illustrated by way of example.

The display element layer DP-OLED includes the light emitting diode OLED. The display element layer DP-OLED includes a pixel definition layer PDL. For instance, the pixel definition layer PDL may be an organic layer.

A first electrode AE is disposed on the organic layer 30. The first electrode AE is connected to the second output electrode SE2 through a fifth through hole CH5 penetrating the organic layer 30. The pixel definition layer PDL is provided with an opening OP formed therein. At least a portion of the first electrode AE is exposed through the opening OP of the pixel definition layer PDL. The opening OP of the pixel definition layer PDL is named as a light emitting opening to distinguish it from other openings.

As illustrated in FIG. 4B, the display area DP-DA includes a light emitting area PXA and a not emitting area NPXA disposed adjacent to the light emitting area PXA. The non-light emitting area NPXA art least partially surrounds the light emitting area PXA. In the present exemplary embodiment, the light emitting area PXA corresponds to a portion of the first electrode AE exposed through the light emitting opening OP.

A hole control layer HCL may be commonly disposed on the light emitting area PXA and the non-light emitting area NPXA. The hole control layer HCL may include a hole transport layer and a hole injection layer. A light emitting layer EML may be disposed on the hole control layer HCL. The light emitting layer EML may be disposed in an area corresponding to the light emitting opening OP. For example, the light emitting layer EML may be formed in each of the pixels after being divided into a plurality of portions. The light emitting layer EML may include an organic material and/or an inorganic material. The light emitting layer EML may generate a predetermined color light.

An electron control layer ECL may be disposed on the light emitting layer EML. The electron control layer may include an electron transport layer and an electron injection layer. The hole control layer HCL and the electron control layer ECL may be commonly formed in a plurality of pixels by using an open mask. A second electrode CE may be disposed on the electron control layer ECL. The second electrode CE may have an integral shape and may be commonly disposed in the plurality of pixels.

As illustrated in FIG. 4B, the upper insulating layer TFL is disposed on the second electrode CE. The upper insulating layer TFL includes a capping layer and a thin film encapsulation layer. The capping layer is disposed on and makes contact with the second electrode CE. For example, the capping layer may include an organic material and/or an inorganic material. For example, the thin film encapsulation layer is disposed on the capping layer and includes a first inorganic layer, an organic layer, and a second inorganic layer.

The capping layer may protect the second electrode CE from a subsequent process, e.g., a sputtering process, and may increase a light emission efficiency of the light emitting diode OLED. For example, the capping layer may have a refractive index greater than that of the first inorganic layer. The first inorganic layer and the second inorganic layer may protect the display element layer DP-OLED from moisture and oxygen, and the organic layer may protect the display element layer DP-OLED from foreign substances such as dust particles. Each of the first inorganic layer and the second inorganic layer is one of a silicon nitride layer, a silicon oxynitride layer, and a silicon oxide layer. In an exemplary embodiment of the present inventive concept, the first inorganic layer and the second inorganic layer include a titanium oxide layer or an aluminum oxide layer. For example, the organic layer includes an acrylic-based organic layer; however, the present inventive concept should not be limited thereto or thereby.

Figure 5:
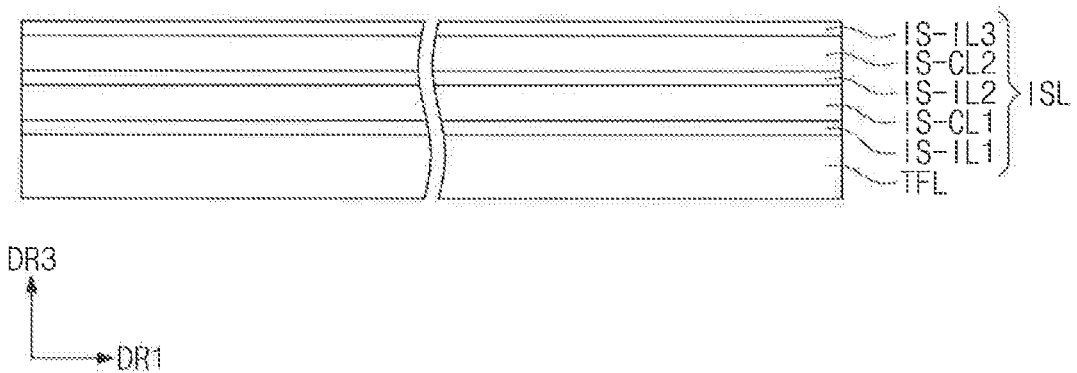
FIG. 5 is a cross sectional view illustrating an input sensor according to an exemplary embodiment of the present inventive concept.

FIG. 5 is a cross-sectional view illustrating the input sensing layer ISL according to an exemplary embodiment of the present inventive concept.

Referring to FIG. 5, the input sensing layer ISL may include a first insulating layer IS-IL1, a first conductive layer IS-CL1, a second insulating layer IS-IL2, a second conductive layer IS-CL2, and a third insulating layer IS-IL3. The first insulating layer IS-IL1 may be disposed on the upper insulating layer TFL. For example, the first insulating layer IS-IL1 may be directly disposed on the upper insulating layer TFL. As an additional example, the first insulating layer IS-IL1, the first conductive layer IS-CL1, the second insulating layer IS-IL2, the second conductive layer IS-CL2, and the third insulating layer IS-IL3 are sequentially stacked. In an exemplary embodiment of the present inventive concept, the first insulating layer IS-IL1 may be omitted.

Each of the first conductive layer IS-CL1 and the second conductive layer IS-CL2 may have a single-layer structure or a multi-layer structure of layers stacked in the third directional axis DR3. For example, the conductive layer having the multi-layer structure may include at least two layers including transparent conductive layers and metal layers. For example, the conductive layer having the multi-layer structure may include metal layers including metals different from each other. The transparent conductive layer may include, for example, indium tin oxide (ITO), indium zinc oxide (IZO), zinc oxide (ZnO), indium tin zinc oxide (ITZO), PEDOT, a metal nanowire, and/or a graphene. The metal layer may include molybdenum, silver, titanium, copper, aluminum, or alloys thereof. For instance, each of the first conductive layer IS-CL1 and the second conductive layer IS-CL2 may have a three-layer structure of titanium/aluminum/titanium.

Each of the first conductive layer IS-CL1 and the second conductive layer IS-CL2 includes a plurality of conductive patterns. Hereinafter, the first conductive layer IS-CL1 will be described as including first conductive patterns, and the second conductive layer IS-CL2 will be described as including second conductive patterns.

Each of the first conductive patterns and the second conductive patterns include sensing electrodes and signal lines connected to the sensing electrodes. Some first conductive patterns are connected to some second conductive patterns to form one sensing electrode (hereinafter, referred to as a "first sensing electrode"). The first sensing electrode is provided as a plurality. The first conductive patterns and the second conductive patterns include a plurality of second sensing electrodes. The first sensing electrodes are insulated from the second sensing electrodes while crossing the second sensing electrodes.

Each of the first, second, and third insulating layers, IS-IL1, IS-IL2, and IS-IL3 may include an inorganic material and/or an organic material. In the present exemplary embodiment, the first insulating layer IS-IL1 and the second insulating layer IS-IL2 may each be an inorganic layer. The inorganic layer may include at least one of aluminum oxide, titanium oxide, silicon oxide, silicon oxynitride, zirconium oxide, and/or hafnium oxide. For example, the third insulating layer IS-IL3 may include an organic layer. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and/or a perylene-based resin. For example, the third insulating layer IS-IL3 may cover the second conductive layer IS-CL2 and provide a base surface.

Figure 6A:
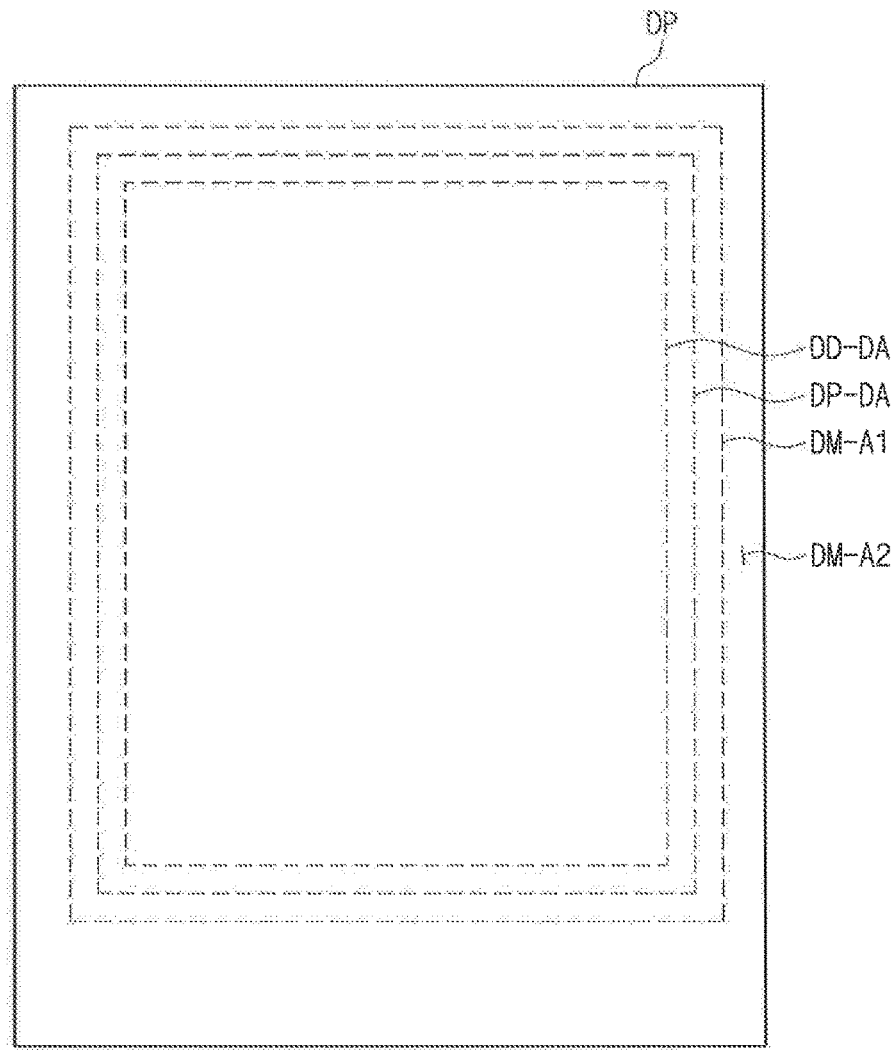
FIG. 6A is a plan view illustrating a display panel according to an exemplary embodiment of the present inventive concept.
Figure 6B:
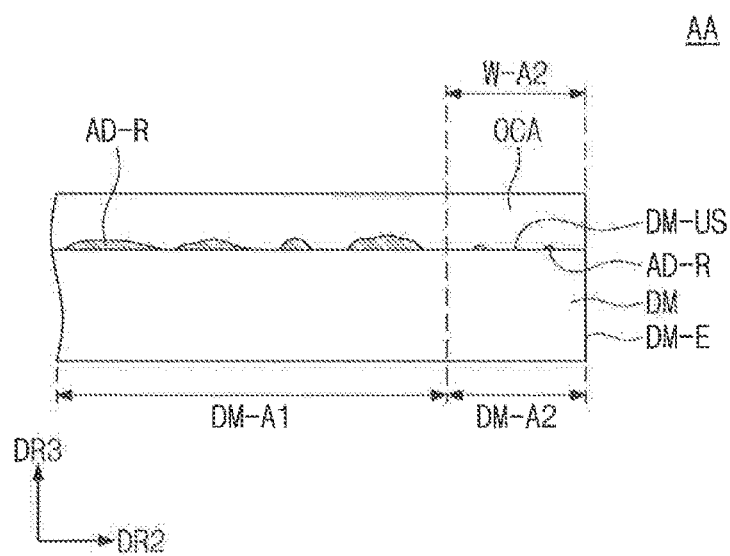
FIG. 6B is an enlarged cross-sectional view illustrating a display device according to an exemplary embodiment of the present inventive concept.

FIG. 6A is a plan view illustrating a display panel DP according to an exemplary embodiment of the present inventive concept. FIG. 6B is an enlarged cross-sectional view illustrating a display device DD according to an exemplary embodiment of the present inventive concept.

FIG. 6A shows an arrangement relation between the image area DD-DA, the display area DP-DA, and a first area DM-A1. As illustrated in FIG. 6A, a display module DM includes the first area DM-A1 (or, e.g., an inner area) and a second area DM-A2 (or, e.g., an outer area) disposed outside of the first area DM-A1. The second area DM-A2 surrounds the first area DM-A1.

When viewed in a plan view, the first area DM-A1 has an area greater than the image area DD-DA and/or the display area DP-DA (refer to FIG. 4A). The image area DD-DA and/or the display area DP-DA are disposed inside of the first area DM-A1 in a plan view. Some portions of the bezel area DD-NDA (refer to FIG. 2A) and the non-display area DP-NDA (refer to FIG. 4A) overlap with the first area DM-A1, and other portions of the bezel area DD-NDA (refer to FIG. 2A) and the non-display area DP-NDA (refer to FIG. 4A) overlap with the second area DM-A2.

The arrangement relation between the image area DD-DA, the display area DP-DA, and the first area DM-A1 in a plan view illustrated in FIG. 6A is merely exemplary. The image area DD-DA has substantially the same shape as the display area DP-DA.

FIG. 6B is an enlarged view of an area "AA" of FIG. 2A. However, the display module DM is illustrated more simply than that in FIG. 2A (e.g., some elements may be omitted for the purpose of clarity). The display module DM should not be limited to the stack structure of the display module DM of FIG. 2A. The display module DM may have the stack structure of the display module DM of FIG. 2B or may have only the display panel DP as illustrated in FIG. 2C.

A base surface DM-US of the display module DM may be an upper surface of the input sensing layer ISL of FIG. 2A, an upper surface of the anti-reflective layer RPL of FIG. 2B, or an upper surface of the display panel DP of FIG. 2C. An upper surface of the display panel DP may be an upper surface of the upper insulating layer TFL of FIG. 3A or an upper surface of the encapsulation substrate ES.

As illustrated in FIG. 6B, an adhesive layer OCA may make contact with the base surface DM-US of the display module DM. A coupling strength of the second area DM-A2 with respect to the display module DM may be larger than the first area DM-A1. A coupling strength of the adhesive layer OCA with respect to the display module DM may be calculated by measuring a stripping strength profile. In the stripping of the adhesive layer OCA from the display module DM along one direction, the stripping strength may be rapidly changed when the stripped area is changed from the second area DM-A2 to the first area DM-A1 or from the first area DM-A1 to the second area DM-A2. After a first stripping area and a second stripping area, which respectively overlap with the first area DM-A1 and the second area DM-A2, are provided in an external member, the strength used to strip the first stripping area and the second stripping area may be evaluated. The stripping strength of the first stripping area and the stripping strength of the second stripping area are measured based on the same area. Referring to FIG. 2A, a polarization film author a phase retardation film corresponding to the anti-reflective panel RPP may be the external member used to evaluate the stripping strength.

Hereinafter, the reason why the coupling strength of the adhesive layer OCA with respect to the display module DM differs depending on the area will be explained. A residual adhesive material AD-R on the base surface DM-US lowers the coupling strength of the adhesive layer OCA with respect to the display module DM. Since the residual adhesive material AD-R is a residual material remaining after a cleaning process, the residual adhesive material AD-R corresponds to a contaminant between an adhesive surface (e.g., an upper surface) of the display module DM and an adhesive surface of the adhesive layer OCA. Accordingly, the residual adhesive material AD-R interferes with a contact between the adhesive surface of the display module DM and the adhesive surface of the adhesive layer OCA.

A residual amount per unit area of the residual adhesive material AD-R with respect to the first area DM-A1 is larger than a residual amount per unit area of the residual adhesive material AD-R with respect to the second area DM-A2. The residual amount of the residual adhesive material AD-R may be calculated as an occupied area of the residual adhesive material AD-R. The reason why the residual amount of the residual adhesive material AD-R depends on the area is related to a manufacturing method of the display device DD, and this will be described later with reference to FIGS. 7A to 7K.

The adhesive layer OCA and the residual adhesive material AD-R ay include different adhesive materials from each other. The adhesive layer OCA may include an acrylic-based adhesive material, and the residual adhesive material AD-R may include a silicon-based or urethane-based adhesive material.

The second area DM-A2 has a width W-A2 from about 50 micrometers (μm) to about 300 micrometers (μm). An edge DM-E of the display module DM is disposed in the second area DM-A2. An area within about 50 micrometers (μm) to about 300 micrometers (μm) inward from the edge DM-E of the display module DM may be defined as the second area DM-A2. The second area DM-A2 is provided in association with the manufacturing process of the display device DD, and this will be described below with reference to FIGS. 7A to 7K.

FIGS. 7A to 7K are views illustrating a manufacturing process of a display device DD according to an exemplary embodiment of the present inventive concept. Hereinafter, the manufacturing method of the display device DD will be explained. However, detailed descriptions of elements that may be the same as elements described with reference to FIGS. 1 to 6B may be omitted.

Figure 7A:
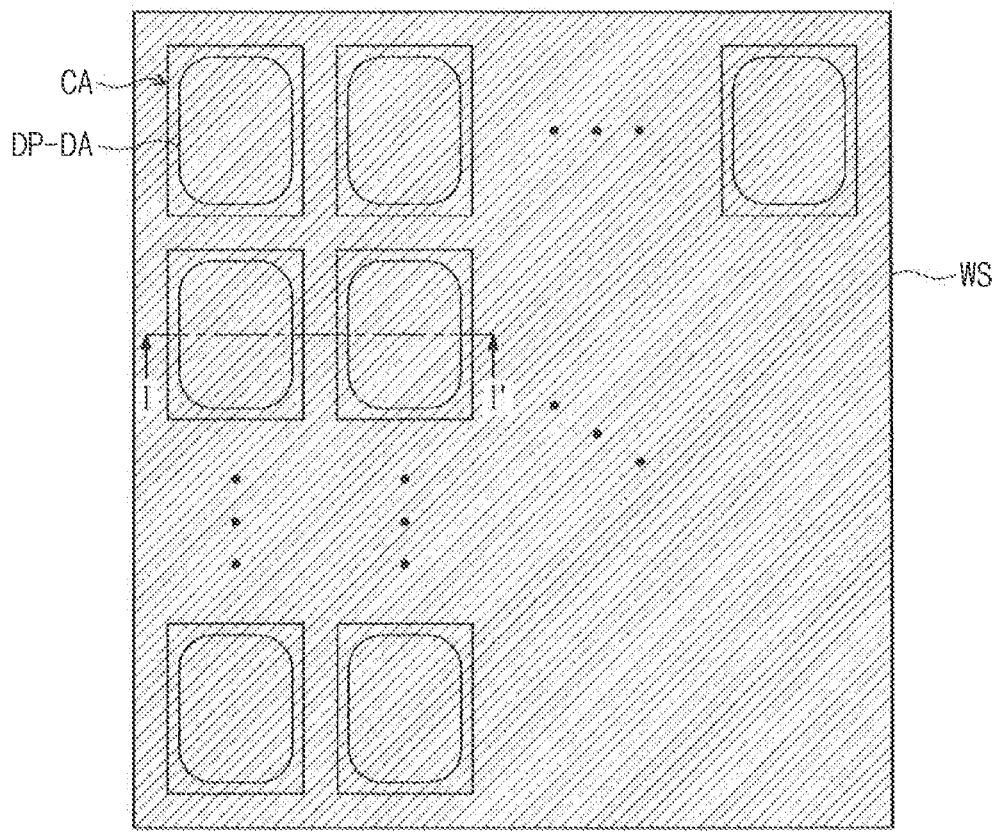
FIGS. 7A, 7B, 7C, 7D, 7E, 7F, 7G, 7H, 7I, 7J, and 7K are views illustrating a manufacturing process of a display device according to an exemplary embodiment of the present inventive concept.

Referring to FIGS. 7A and 78, a working panel WS is provided. The working panel WS is provided with a working protective film PF attached thereto. The working panel WS includes a plurality of cell areas CA. The cell areas CA are separated from each other to form the display module DM (refer to FIG. 2A and FIG. 2B) or the display panel DP (refer to FIG. 2C). FIG. 7A shows the display area DP-DA of the display panel DP in the cell area CA.

The display module DM or the display panel DP is manufactured in every cell area CA of the working panel WS, and the working protective film PF is attached to the working panel WS to protect the cell areas CA. The working protective film PF includes a plastic film such as polyethylene terephthalate (PET); however, the present inventive concept should not be particularly limited thereto.

Figure 7B:
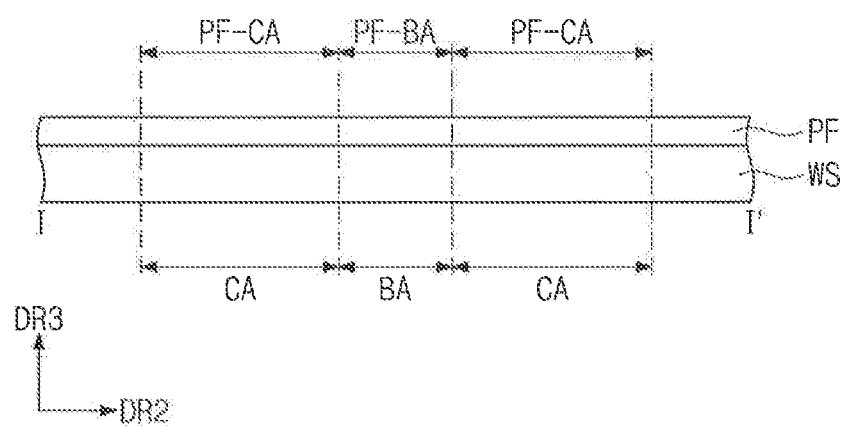

In FIG. 7B, an adhesive layer (hereinafter, referred to as a "temporary adhesive layer") between the working protective film PF and the working panel WS is not illustrated. The temporary adhesive layer has a relatively low adhesive strength and a relatively high viscoelasticity to minimize the amount of the residual adhesive material remaining on the working panel WS when the working protective film PF is removed from the working panel WS. The temporary adhesive layer includes a silicon-based or urethane-based adhesive material.

The working panel WS includes a peripheral area BA adjacent to the cell areas CA. The working protective film PF includes a boundary area PF-BA and film areas PF-CA. The peripheral area BA corresponds to a boundary area PF-BA between the cell areas CA. Film areas PF-CA corresponding to the cell areas CA and a boundary area PF-BA corresponding to the peripheral area BA may be provided in the working protective film PF.

Then, the working protective film PF is patterned. The film areas PF-CA and the boundary area PF-BA are separated from each other by the patterning process. A portion corresponding to the boundary area PF-BA is separated and removed, and portions corresponding to the film areas PF-CA remain on the working panel WS. When the boundary area PF-BA is removed, the peripheral area BA is exposed to the outside. The portion of the working-protective film PF corresponding to the film area PF-CA is a cell protective film PF-C (refer to FIG. 7C).

The patterning process of the working protective film PF will be described in detail as follows. First, a boundary line (or, e.g., a film cutting line) is formed between the film areas PF-CA and the boundary area PF-BA using, for example, a laser beam. The working protective film PF is cut along the boundary line, and the temporary adhesive layer OCA-T disposed between the working protective film PF and the working panel WS is partially cut. Then, the boundary area PF-BA is physically stripped using a stripper.

Figure 7C:
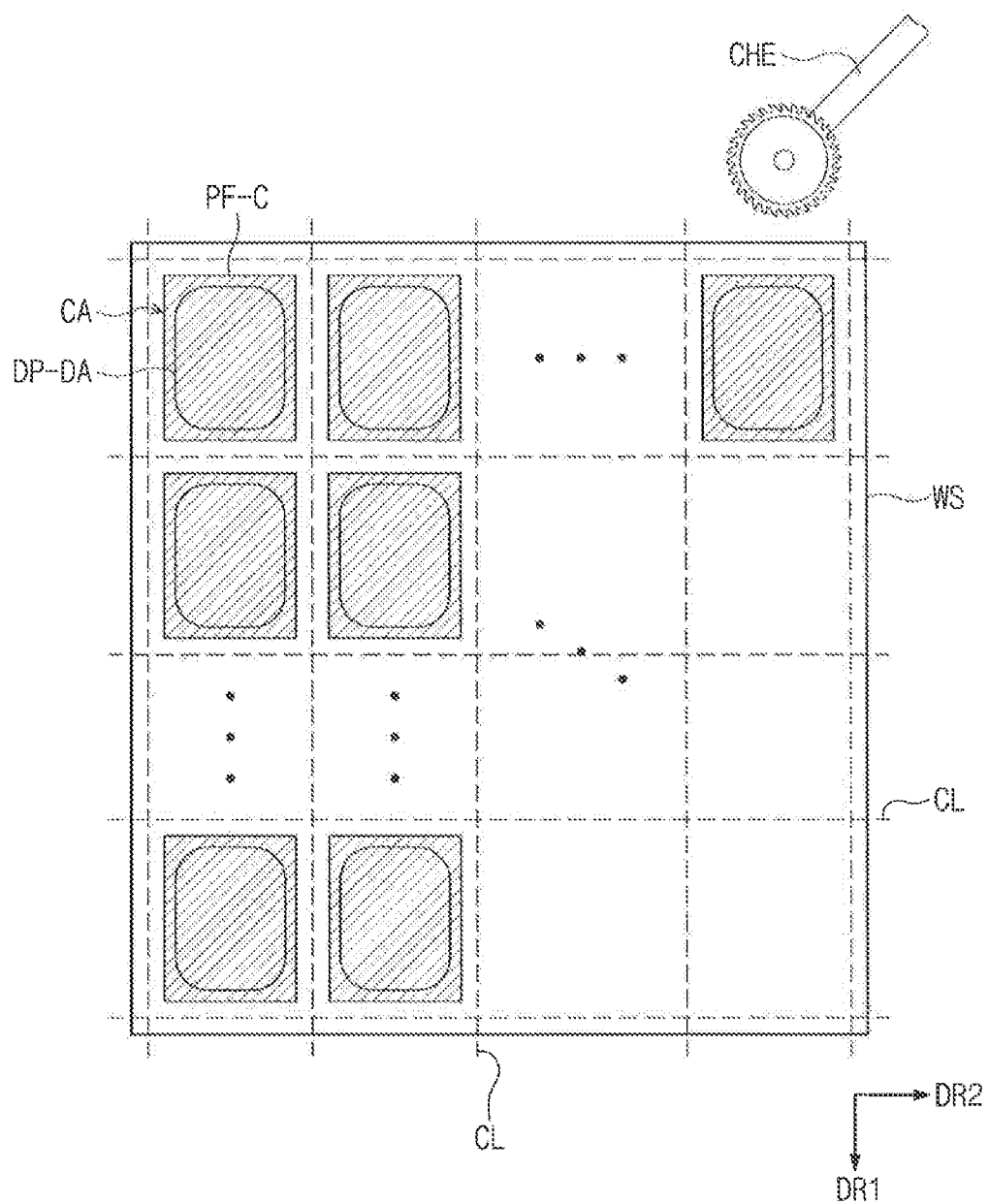

Then, referring to FIG. 7C, the working panel WS is cut. The working panel WS is cut by setting a cutting line CL in the peripheral area BA and cutting the working panel WS along the cutting line CL using a cutting wheel CHE.

Accordingly, a plurality of display modules DM each on which the cell protective film PF-C is attached may be formed.

Figure 7D:
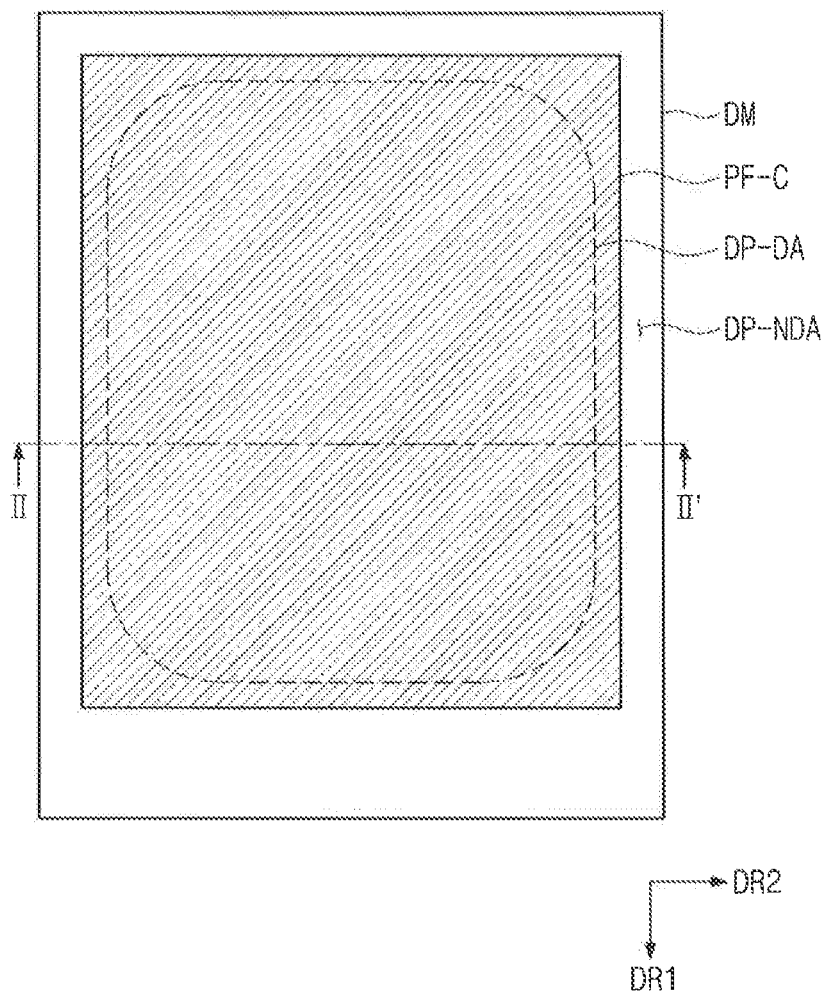
Figure 7E:
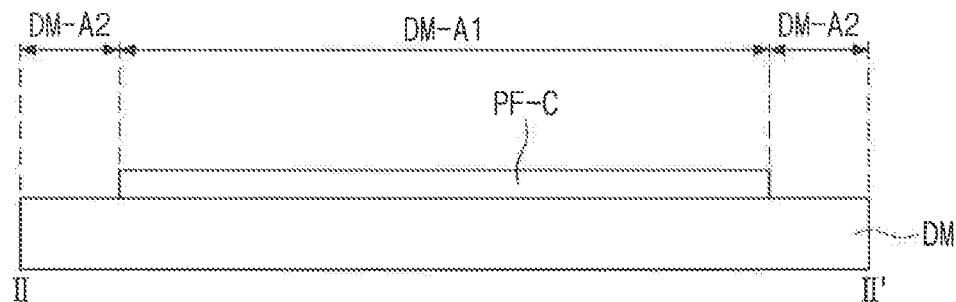
Figure 7E:
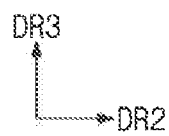

FIGS. 7D and 7E show one display module DM. The display module DM has an area greater than the cell area CA illustrated in FIG. 7A. A portion of the display module DM is exposed without being covered by the cell protective film PF-C. The portion of the display module DM, which is exposed without being covered by the cell protective film PF-C, corresponds to the second area DM-A2 illustrated in FIGS. 2A and 2B or the second area DM-A2 illustrated in FIG. 2C. A portion of the display module DM, which overlaps with the cell protective film PF-C, corresponds to the first area DM-A1 illustrated in FIGS. 2A and 2B or the first area DM-A1 illustrated in FIG. 2C.

In an exemplary embodiment of the present inventive concept, at least a portion of the non-display area DP-NDA is not covered by the cell protective film PF-C.

Figure 7F:
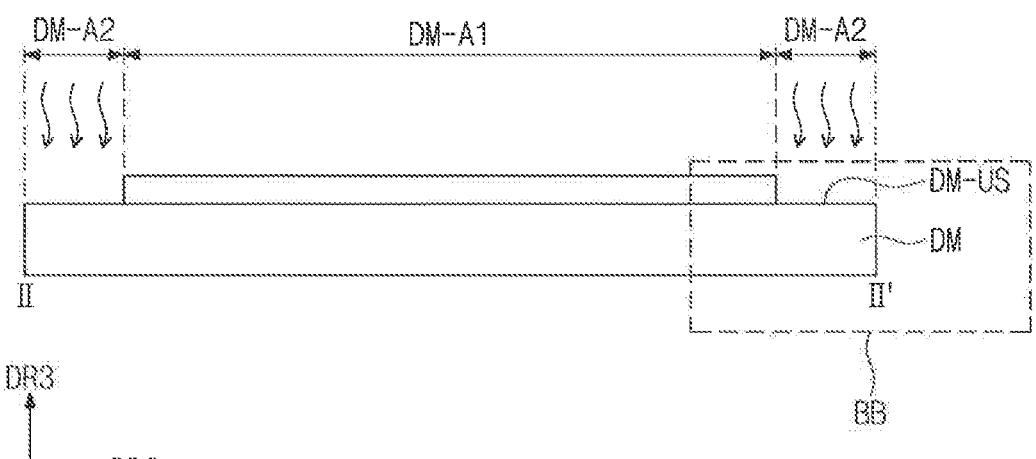
Figure 7F:
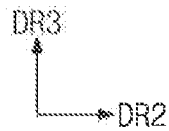
Figure 7G:
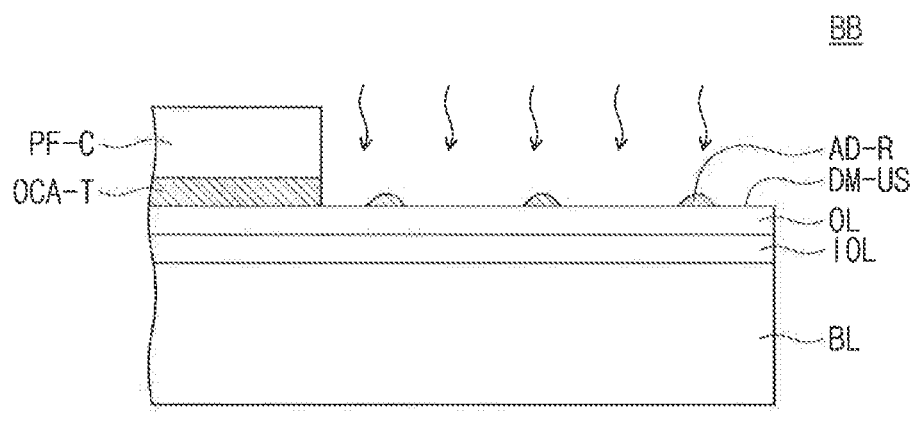
Figure 7G:
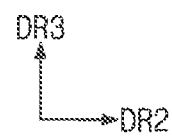

Then, referring to FIGS. 7F and 7G, the second area DM-A2 (or, e.g., the outer area) of the display module DM is surface-modified.

In the exemplary embodiment of the present inventive concept, the surface modification process may include a plasma treatment process. When the plasma treatment process is performed using a nitrogen gas or an oxygen gas, polar reactors are coupled to the second area DM-A2 of the base surface DM-US, and a surface energy of the second area DM-A2 of the base surface DM-US increases. After the plasma treatment process, a hydrophilic property of the second area DM-A2 of the base surface DM-US increases.

Referring to FIG. 7G, the base surface DM-US may be a surface of the organic layer OL. For example, the upper surface of the organic layer OL may be the base surface DM-US. The organic layer OL may be an uppermost insulating layer of the input sensing layer ISL illustrated in FIGS. 2A and 2B or an uppermost insulating layer of the display panel DP illustrated in FIG. 2C. The polar reactors may be chemically bonded to a side chain or a main chain of a polymer constituting the organic layer OL by the plasma treatment. In addition, FIG. 7G shows a cross section of the second area DM-A2 in which the base layer BL, the inorganic layer IOL, and the organic layer OL are stacked as a representative example; however, the cross section of the second area DM-A2 should not be limited thereto or thereby. For example, a plurality of insulating layers may be disposed between the base layer BL and the organic layer OL.

In the exemplary embodiment of the present inventive concept, the surface modification process may include a surfactant providing process. The surfactant may be aligned so that a hydrophobic group faces the base surface DM-US and a hydrophilic group faces outward. Therefore, the hydrophilic property of the second area DM-A2 may increase.

In addition, FIG. 7G shows the residual adhesive material AD-R remaining on the second area DM-A2. The residual adhesive material AD-R corresponds to some of the temporary adhesive layer OCA-T, which remain as a residue without being completely removed when the boundary area PF-BA of the working protective film PF illustrated in FIGS. 7B and 7C is removed.

Figure 7H:
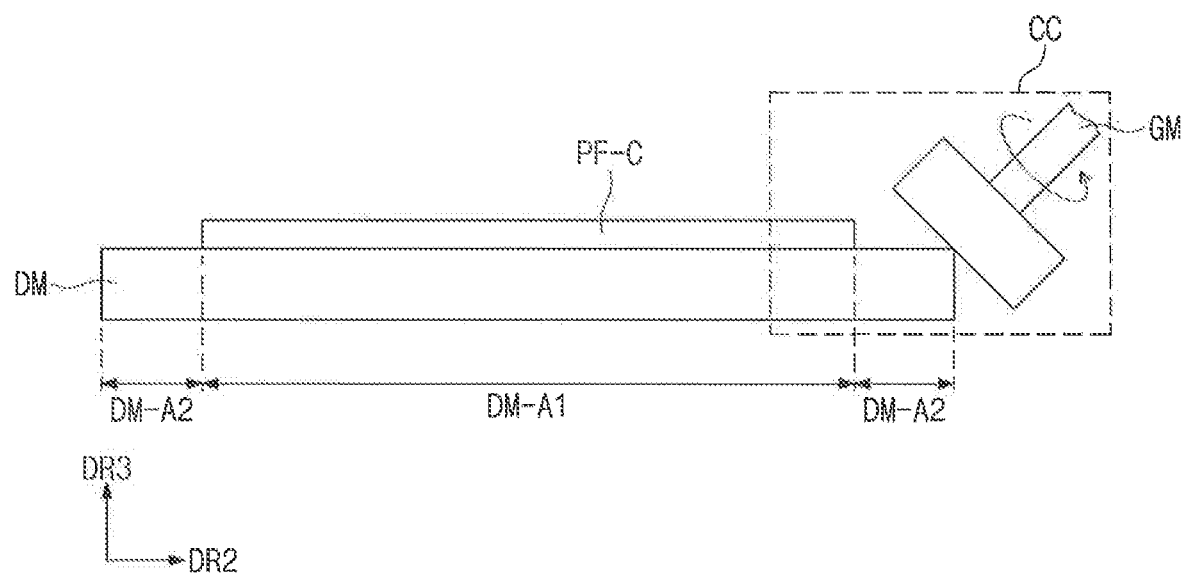
Figure 7I:
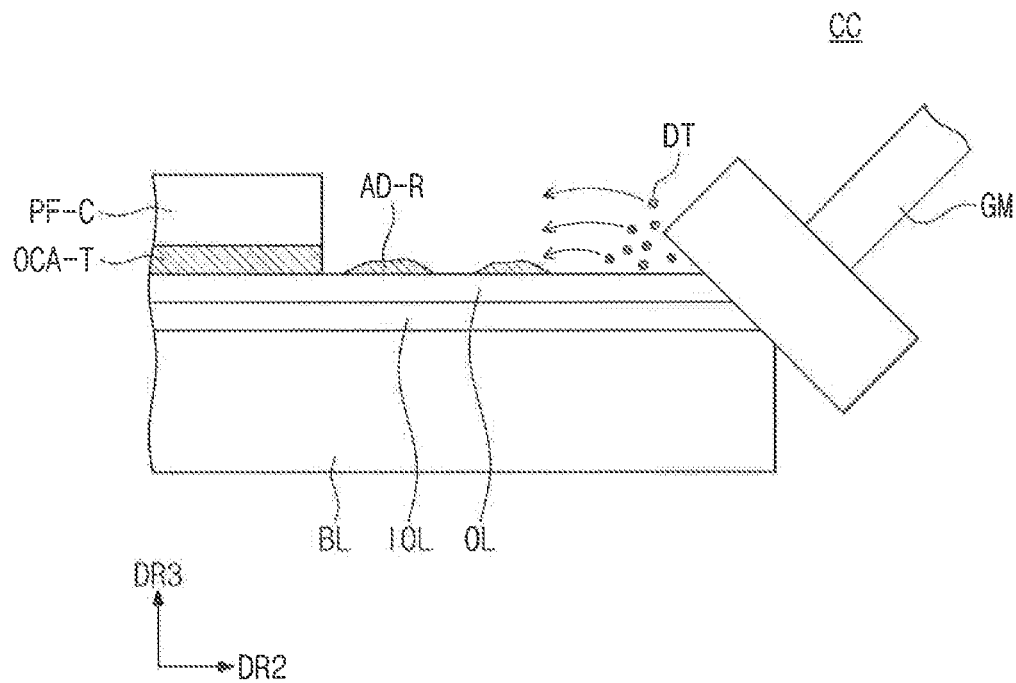

After that, referring to FIGS. 7H and 7I, an edge of the display module DM is ground. When the edge is ground by using a grinder GM, a sludge DT of the base layer BL, the inorganic layer IOL, and the organic layer OL may be generated. The sludge DT corresponds to a ground mixture of the base layer BL, the inorganic layer IOL, and the organic layer OL.

Figure 7J:
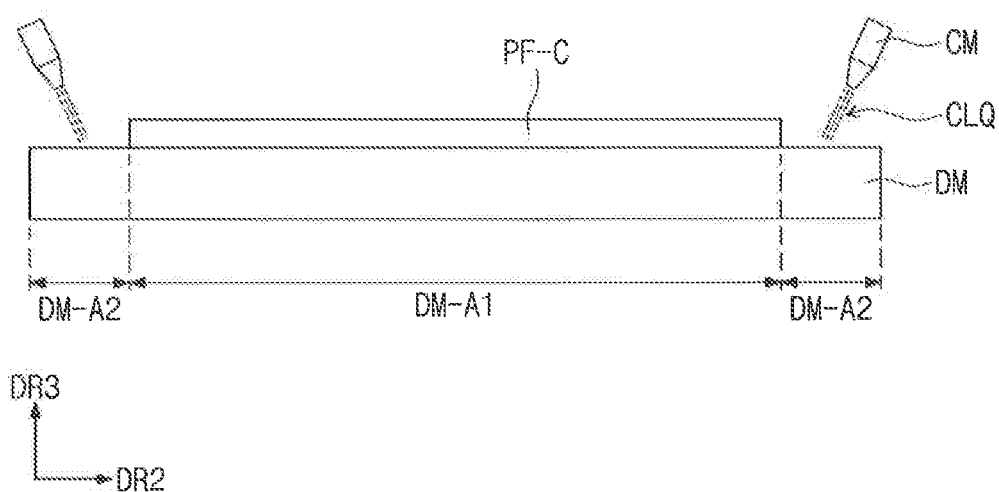

The sludge DT may contaminate the second area DM-A2. Some of the sludge DT may adhere to the residual adhesive material AD-R. A cleaning process illustrated in FIG. 7J is performed to remove the sludge DT. A cleaner CM sprays a cleaning liquid CLQ to the second area DM-A2. In the present exemplary embodiment, the cleaning liquid CLQ may include a hydrophilic liquid, for example, water.

The cleaning liquid CLQ removes the sludge DT that contaminates the second area DM-A2. Further, the cleaning liquid CLQ may remove the residual adhesive material AD-R existing in the second area DM-A2. According to the present exemplary embodiment, since the surface modification process is performed on the second area DM-A2 as illustrated in FIGS. 7F and 7G, a cleaning efficiency is increased. When the sludge DT and the residual adhesive material AD-R are removed, a coupling strength between the adhesive layer OCA (refer to FIG. 7K) and the second area DM-A2 increases during a coupling process described later, and a defect in which the adhesive layer is stripped may be prevented.

In the exemplary embodiment of the present inventive concept, the cleaning liquid CLQ may further include the surfactant. The surfactant may be bonded to the residual adhesive material AD-R, and thus the cleaning efficiency of the residual adhesive material AD-R may be increased.

As described above, the cleaning process is performed with the hydrophilic liquid by surface-modifying the second area DM-A2 to a hydrophilic surface; however, the present inventive concept should not be limited thereto or thereby. The cleaning process may be performed with a hydrophobic liquid by surface-modifying the second area DM-A2 to a hydrophobic surface.

As described above, the grinding process is performed after the surface modification process; however, the present inventive concept should not be limited thereto or thereby. For example, the surface modification process may be performed after the grinding process.

Figure 7K:
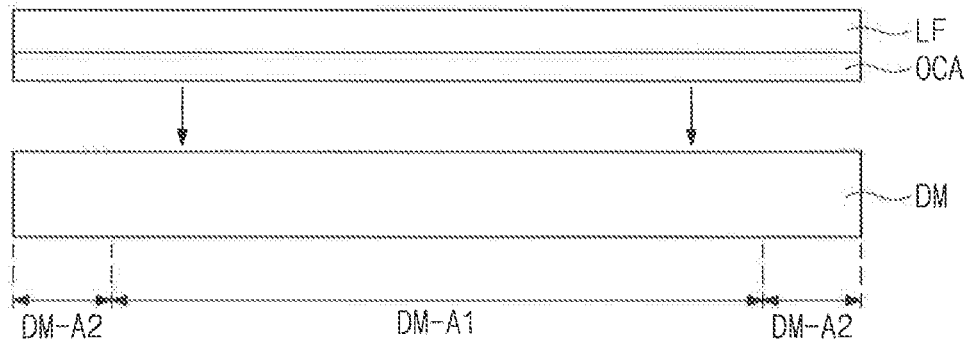

The cell protective film PF-C is removed from the display module DM after the cleaning process. FIG. 7K shows the display module DM from which the cell protective film PF-C is removed. Although not illustrated in figures, when the cell protective film PF-C is removed, the residual adhesive material may remain in the first area DM-A1 of the base surface DM-US. The residual adhesive material corresponds to some of the temporary adhesive layer OCA-T, which remain as a residue without being completely removed when the cell protective film PF-C illustrated in FIGS. 7G and 7I is removed. Since the residual adhesive material AD-R (refer to FIG. 7I) is removed from the second area DM-A2 of the base surface DM-US by the cleaning process, the residual amount per unit of the second area DM-A2 is smaller than that of the first area DM-A1.

In the exemplary embodiment of the present inventive concept, the cleaning process may be performed after removing the cell protective film PF-C or an additional cleaning process may be performed. The second area DM-A2 that is surface-modified has a higher cleaning efficiency than the first area DM-A1 and has a smaller residual amount of the residual adhesive material AD-R per unit area than the first area DM-A1.

Then, the display module DM is coupled to the external member. FIG. 7K shows a representative example of a coupling process of an optical film LF to the display module DM. The optical film LE to which the adhesive layer OCA is attached may be laminated on the display module DM. The optical film LF may include at least a polarization film. For example, the external member may include the optical film LF, a polarization film, a window and/or a phase retardation film. In an exemplary embodiment of the present inventive concept, the polarization film and the phase retardation film may correspond to the anti-reflective panel RPP (See FIG. 2A). Although not illustrated separately, another external member may be laminated on the optical film LF.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A method of manufacturing a display device, comprising:
    providing a working panel attached to a working protective film, the working panel comprising a plurality of cell areas and a peripheral area adjacent to the cell areas;
    patterning the working protective film to expose the peripheral area to an outside and to remain cell protective films corresponding to the cell areas;
    cutting the working panel along the peripheral area to form a plurality of display modules, wherein the cell protective films of the working protective film are respectively attached to the plurality of display modules;
    surface-modifying an outer area, of a first display module of the plurality of display modules, that is not covered by a corresponding cell protective film among the cell protective films;
    grinding an edge of the outer area of the first display module;
    cleaning the first display module;
    removing the corresponding cell protective film from the first display module; and
    attaching the first display module to an external member.

2. The method of claim 1, wherein the surface-modifying comprises plasma-treating the outer area of the first display module.

3. The method of claim 2, wherein a hydrophilic property of the outer area of the first display module increases after the plasma-treating.

4. The method of claim 1, wherein the surface-modifying comprises providing a surfactant to the outer area of the first display module.

5. The method of claim 1, wherein the cleaning of the first display module comprises providing a cleaning liquid to the outer area of the first display module.

6. The method of claim 5, wherein the cleaning liquid comprises a surfactant.

7. The method of claim 1, wherein an area overlapping with the corresponding cell protective film of the first display module is an inner area of the first display module, and the inner area is greater than the outer area of the first display module.

8. The method of claim 7, wherein the outer area has a width from about 50 micrometers to about 300 micrometers.

9. The method of claim 7, wherein, in the removing of the corresponding cell protective film, the inner area of the first display module has a residual amount per unit area of a residual adhesive material, wherein the residual amount per unit area of the residual adhesive material of the inner area is greater than that of the outer area of the first display module.

10. The method of claim 7, wherein a coupling strength between the first display module and the external member in the outer area is greater than a coupling strength between the first display module and the external member in the inner area.

* * * * *